US009133367B2

(12) United States Patent
Ha et al.

(10) Patent No.: US 9,133,367 B2
(45) Date of Patent: Sep. 15, 2015

(54) OPTICALLY CLEAR ADHESIVE FOR DICING DIE BONDING FILM

(75) Inventors: Kyoung Jin Ha, Uiwang-si (KR); Baek Soung Park, Uiwang-si (KR); Ji Ho Kim, Uiwang-si (KR); Min Kyu Hwang, Uiwang-si (KR); Kil Sung Lee, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 264 days.

(21) Appl. No.: 13/279,564

(22) Filed: Oct. 24, 2011

(65) Prior Publication Data
US 2012/0171481 A1 Jul. 5, 2012

(30) Foreign Application Priority Data

Dec. 30, 2010 (KR) .................. 10-2010-0139675
Dec. 30, 2010 (KR) .................. 10-2010-0139682

(51) Int. Cl.
| | |
|---|---|
| *C09J 7/02* | (2006.01) |
| *C09J 143/02* | (2006.01) |
| *C09J 133/10* | (2006.01) |
| *C09J 133/08* | (2006.01) |
| *C09J 143/04* | (2006.01) |
| *H01L 21/683* | (2006.01) |
| *C08F 8/30* | (2006.01) |
| *C09J 133/14* | (2006.01) |

(52) U.S. Cl.
CPC ... *C09J 7/02* (2013.01); *C08F 8/30* (2013.01); *C09J 133/08* (2013.01); *C09J 133/10* (2013.01); *C09J 133/14* (2013.01); *C09J 143/02* (2013.01); *C09J 143/04* (2013.01); *H01L 21/6836* (2013.01); *C09J 2201/36* (2013.01); *C09J 2201/606* (2013.01); *C09J 2201/61* (2013.01); *C09J 2203/326* (2013.01); *C09J 2433/00* (2013.01); *H01L 2221/68336* (2013.01); *H01L 2224/8085* (2013.01); *H01L 2224/80855* (2013.01); *H01L 2224/8385* (2013.01); *H01L 2224/83855* (2013.01); *Y10T 428/2848* (2015.01); *Y10T 428/31786* (2015.04)

(58) Field of Classification Search
CPC .......... C09J 7/02; C09J 133/08; C09J 133/10; C09J 133/14; C09J 143/02; C09J 143/04; C09J 2203/326; H01L 21/6836; H01L 2224/8085; H01L 2224/80855; H01L 2224/8385; H01L 2224/83855
USPC .......... 525/329.7, 329.9, 330.3, 330.5, 326.6; 428/354, 355 EN, 355 AC, 500, 515, 428/516, 522
See application file for complete search history.

(56) References Cited

U.S. PATENT DOCUMENTS

| | | | | |
|---|---|---|---|---|
| 4,843,134 A | * | 6/1989 | Kotnour et al. | 526/318.4 |
| 5,962,540 A | * | 10/1999 | Friese et al. | 521/128 |
| 2005/0245711 A1 | | 11/2005 | Narayan-Sarathy et al. | |
| 2006/0188712 A1 | * | 8/2006 | Okada et al. | 428/354 |
| 2011/0247746 A1 | * | 10/2011 | Schumacher et al. | 156/210 |

FOREIGN PATENT DOCUMENTS

| | | |
|---|---|---|
| CN | 1574286 A | 2/2005 |
| CN | 1827725 A | 9/2006 |
| CN | 1968979 A | 5/2007 |
| JP | 58-007470 A | 1/1983 |
| JP | 2001-131511 A | 5/2001 |
| JP | 2008-222954 * | 9/2008 |
| JP | 2008-222954 A | 9/2008 |
| WO | WO 2010/041299 A1 | 4/2010 |

OTHER PUBLICATIONS

JP 2008-222954 machine translation, Sep. 2008.*
Chinese Offica Action in CN 201110347640.6, dated Jun. 27, 2013, with English translation (Ha, et al.).
Chinese Office Action dated Mar. 3, 2014, application 201110347640.6.
Office Action mailed Aug. 6, 2014 in corresponding Chinese Patent Application No. 201110347640.6.
Provisional double patenting rejection of claims in parent U.S. Appl. No. 13/919,149; USPTO Office action mailed Sep. 17, 2014, in U.S. Appl. No. 13/919,149.

* cited by examiner

Primary Examiner — Roberto Rabago
(74) Attorney, Agent, or Firm — Lee & Morse, P.C.

(57) ABSTRACT

An optically clear adhesive, a dicing die bonding film, and a semiconductor device, the optically clear adhesive including a curing agent; and an acrylic copolymer, the acrylic copolymer including an alkyl group, a hydroxyl group, and at least one of a phosphate group and a silane group.

26 Claims, 1 Drawing Sheet

OPTICALLY CLEAR ADHESIVE FOR DICING DIE BONDING FILM

BACKGROUND

1. Field of the Invention

Embodiments relate to an optically clear adhesive for a dicing die bonding film.

2. Description of the Related Art

Dicing die bonding films are used in the fabrication processes of semiconductor devices. Such dicing die bonding films may be categorized into photocurable films and non-UV irradiation type films depending on whether they are cured by UV irradiation.

SUMMARY

Embodiments are directed to an optically clear adhesive for a dicing die bonding film.

The embodiments may be realized by providing an optically clear adhesive including a curing agent; and an acrylic copolymer, the acrylic copolymer including an alkyl group, a hydroxyl group, and at least one of a phosphate group and a silane group.

The acrylic copolymer may be a copolymer of a (meth) acrylate having at least one hydroxyl group, a (meth)acrylate having at least one alkyl group, and a (meth)acrylate having at least one phosphate group.

The (meth)acrylate having at least one phosphate group may have a structure of Formula 1:

$$CH_2=CR-C(=O)O-(CH_2)_m-O-P(=O)(OR1)(OR2) \quad (1),$$

wherein, in Formula 1, R is —H or —$(CH_2)_n$—$CH_3$, n is an integer from 0 to about 5, R1 and R2 are each independently hydrogen, a $C_1$-$C_{10}$ alkyl group, or a $C_6$-$C_{20}$ aryl group, and m is an integer from 1 to about 10.

The (meth)acrylate having at least one phosphate group may be ethylene glycol (meth)acrylate phosphate.

The (meth)acrylate having at least one phosphate group may be present in the acrylic copolymer in an amount of about 0.1 to about 10 parts by weight, based on 100 parts by weight of the acrylic copolymer.

The (meth)acrylate having at least one phosphate group, the (meth)acrylate having at least one alkyl group, and the (meth)acrylate having at least one hydroxyl group may be present in the acrylic copolymer in a molar ratio of about 0.5-2:70-75:24.5-28.

The acrylic copolymer may be prepared by copolymerizing a (meth)acrylate having at least one hydroxyl group with a (meth)acrylate having at least one alkyl group to prepare a base binder, and reacting the base binder with a compound having at least one silane group.

The compound having at least one silane group may be selected from the group of 3-isocyanatopropyltriethoxysilane, 3-isocyanatopropyltrimethoxysilane, vinyltrichlorosilane, vinyltrimethoxysilane, vinyltriethoxysilane, and mixtures thereof.

The acrylic copolymer may be a copolymer of a (meth) acrylate having at least one hydroxyl group, a (meth)acrylate having at least one alkyl group, and a (meth)acrylate having at least one silane group.

The (meth)acrylate having at least one silane group may have a structure of Formula 2:

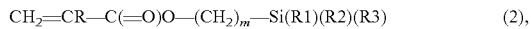

wherein, in Formula 2, R is —H or —$(CH_2)_n$—$CH_3$, n is an integer from 0 to about 5, R1, R2, and R3 are each independently hydrogen, a $C_1$-$C_{10}$ alkyl group, a $C_6$-$C_{20}$ aryl group, or a $C_1$-$C_{10}$ alkoxy group, and m is an integer from 1 to about 10.

The (meth)acrylate having at least one silane group, the (meth)acrylate having at least one alkyl group, and the (meth) acrylate having at least one hydroxyl group may be present in the acrylic copolymer in a molar ratio of about 3-5.5:65.5-73:24-29.

The (meth)acrylate having at least one silane group may be present in the acrylic copolymer in an amount of about 3 to about 10 parts by weight, based on 100 parts by weight of the acrylic copolymer.

The hydroxyl group may be included in a repeating unit derived from a monomer including a (meth)acrylate selected from the group of 2-hydroxyethyl (meth)acrylate, 4-hydroxybutyl (meth)acrylate, 2-hydroxypropyl (meth)acrylate, 2-hydroxybutyl (meth)acrylate, 6-hydroxyhexyl (meth)acrylate, 1,4-cyclohexanedimethanol mono(meth)acrylate, 1-chloro-2-hydroxypropyl (meth)acrylate, diethylene glycol mono (meth)acrylate, 1,6-hexanediol mono(meth)acrylate, pentaerythritol tri(meth)acrylate, dipentaerythritol penta(meth) acrylate, neopentyl glycol mono(meth)acrylate, trimethylolpropane di(meth)acrylate, trimethylolethane di(meth)acrylate, 2-hydroxy-3-phenyloxypropyl (meth) acrylate, 4-hydroxycyclohexyl (meth)acrylate, 2-hydroxy-3-phenyloxy (meth)acrylate, 4-hydroxycyclohexyl (meth)acrylate, and cyclohexanedimethanol mono(meth)acrylate.

The acrylic copolymer may further include at least one of an epoxy group and a carboxyl group.

The epoxy group may be included in a repeating unit derived from an unsaturated epoxy compound having a structure of Formula 3:

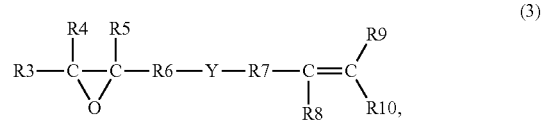

wherein, in Formula 3, R3, R4, R5, R8, R9, and R10 are each independently H, a $C_1$-$C_{12}$ saturated or unsaturated alkyl group, or a $C_6$-$C_{14}$ aryl group optionally substituted with at least one $C_1$-$C_{12}$ saturated or unsaturated alkyl group, Y is an ether group (—O—), a carboxyl group (—O(C=O)— or —(C=O)O—), a $C_1$-$C_{12}$ alkylene group, or a $C_6$-$C_{14}$ arylene group optionally substituted with at least one $C_1$-$C_{12}$ saturated or unsaturated alkyl group, provided that, when Y is an ether group (—O—) or a carboxyl group (—O(C=O)— or —(C=O)O—), R6 and R7 are each independently a single bond, a $C_1$-$C_{12}$ alkylene group, or a $C_6$-$C_{14}$ arylene group optionally substituted with at least one $C_1$-$C_{12}$ saturated or unsaturated alkyl group, and provided that, when Y is a $C_1$-$C_{12}$ alkylene group or a $C_6$-$C_{14}$ arylene group optionally substituted with at least one $C_1$-$C_{12}$ saturated or unsaturated alkyl group, R6 and R7 are omitted.

The unsaturated epoxy compound having the structure of Formula 3 may be selected from the group of glycidyl (meth) acrylate, epoxy alkyl acrylate, allyl glycidyl ether, aryl glycidyl ether, vinyl glycidyl ether, glycidyl itaconate, and mixtures thereof.

The acrylic copolymer may be a copolymer of a (meth) acrylate having at least one hydroxyl group, a (meth)acrylate having at least one alkyl group, at least one of a (meth) acrylate having at least one phosphate group and a compound having at least one silane group, and at least one of an unsaturated epoxy compound having at least one epoxy group and a compound having at least one carboxyl group.

The acrylic copolymer may be formed using the compound having at least one carboxyl group, the compound having at least one carboxyl group having a structure of Formula 4 or 5:

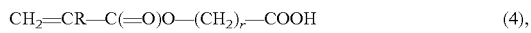

$$CH_2=CR-C(=O)O-(CH_2)_r-COOH \quad (4),$$

wherein, in Formula 4, R is —H or —$(CH_2)_n$—$CH_3$, n is an integer from 0 to about 5, and r is an integer from 1 to about 10;

$$CH_2=CR-C(=O)OH \quad (5),$$

wherein, in Formula 5, R is —H or —$(CH_2)_n$—$CH_3$ and n is an integer from 0 to about 5.

The (meth)acrylate having at least one phosphate group, the unsaturated epoxy compound having at least one epoxy group, the (meth)acrylate having at least one alkyl group, and the compound having at least one carboxyl group may be present in the acrylic copolymer in a molar ratio of about 0.5-2:4-7:64-73.5:22-27.

The (meth)acrylate having at least one phosphate group, the (meth)acrylate having at least one alkyl group, the (meth)acrylate having at least one hydroxyl group, and the compound having at least one carboxyl group may be present in the acrylic copolymer in a molar ratio of about 0.5-2.5:5-8.5:82-93.5:1-7.

The (meth)acrylate having at least one phosphate group, the unsaturated epoxy compound having at least one epoxy group, the (meth)acrylate having at least one alkyl group, the (meth)acrylate having at least one hydroxyl group and the compound having at least one carboxyl group may be present in the acrylic copolymer in a molar ratio of about 0.5-2:4-6.5:59-73.5:21-27:1-5.5.

The (meth)acrylate having at least one alkyl group, the (meth)acrylate having at least one hydroxyl group, the compound having at least one silane group, and the unsaturated epoxy compound having at least one epoxy group may be present in the acrylic copolymer in a molar ratio of about 62.5-72:20-23:3-5.5:5-9.

The (meth)acrylate having at least one alkyl group, the (meth)acrylate having at least one hydroxyl group, the compound having at least one silane group, and the compound having at least one carboxyl group may be present in the acrylic copolymer in a molar ratio of about 59.4-76:9-27:3-4.5:2-9.

The (meth)acrylate having at least one alkyl group, the (meth)acrylate having at least one hydroxyl group, the compound having at least one silane group, the unsaturated epoxy compound having at least one epoxy group, and the compound having at least one carboxyl group may be present in the acrylic copolymer in a molar ratio of about 53.5-67:18-28:2-5.5:1-4.5:2-8.5.

The curing agent may be an isocyanate curing agent.

The curing agent may be present in an amount of about 3 to about 10 parts by weight, based on 100 parts by weight of the acrylic copolymer.

The optically clear adhesive may not include photoinitiator.

The acrylic copolymer may have a viscosity at 25° C. of about 4,000 to about 6,000 cps.

The embodiments may also be realized by providing a dicing die bonding film including a base film; an optically clear adhesive layer on the base film; and a bonding layer on the optically clear adhesive layer, wherein the optically clear adhesive layer is formed of the optically clear adhesive according to an embodiment.

An adhesive strength between the optically clear adhesive layer and a ring frame may be about 1 to about 3 N/25 mm.

An adhesive strength between the optically clear adhesive layer and the bonding layer may be about 0.05 to about 0.5 N/25 mm.

The embodiments may also be realized by providing a semiconductor device prepared using the dicing die bonding film according to an embodiment, wherein the bonding layer of the dicing die bonding film is attached to one side of a wafer and the optically clear adhesive layer of the dicing die bonding film is fixed on a ring frame.

DETAILED DESCRIPTION

Figure 1:
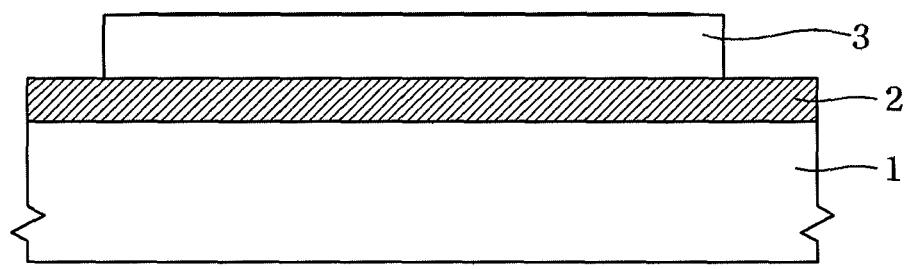
FIG. 1 illustrates a dicing die bonding film according to an exemplary embodiment.

Korean Patent Application Nos. 10-2010-0139675 and 10-2010-0139682, filed on Dec. 30, 2010, in the Korean Intellectual Property Office, are incorporated by reference herein in their entirety.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present.

An embodiment provides an optically clear adhesive including, e.g., a curing agent and an acrylic copolymer.

Acrylic Copolymer

The acrylic copolymer may include an alkyl group, a hydroxyl group, and at least one of a phosphate group and a silane group. The acrylic copolymer may have a viscosity (at 25° C.) of about 4,000 to about 100,000 cps.

An order of arrangement of the alkyl group, hydroxyl group, and the phosphate and/or silane groups is not particularly limited, and may be varied as desired. In an implementation, like groups may be consecutively arranged in blocks in the acrylic copolymer.

In an implementation, the acrylic copolymer may be a copolymer of, e.g., a (meth)acrylate having at least one hydroxyl group, a (meth)acrylate having at least one alkyl group, and a (meth)acrylate having at least one phosphate group.

The acrylic copolymer may be prepared by, e.g., copolymerizing monomers including a (meth)acrylate having at least one hydroxyl group and a (meth)acrylate having at least one alkyl group, to prepare a base binder, and reacting the base binder with a (meth)acrylate having at least one phosphate group.

In another implementation, the acrylic copolymer may be a copolymer of, e.g., a (meth)acrylate having at least one hydroxyl group, a (meth)acrylate having at least one alkyl group, and a compound having at least one silane group.

The acrylic copolymer may be prepared by, e.g., copolymerizing monomers including a (meth)acrylate having at least one hydroxyl group with a (meth)acrylate having at least one alkyl group to prepare a base binder, and reacting the base binder with a compound having at least one silane group.

The (meth)acrylate having a hydroxyl group may refer to a monomer that has a hydroxyl group and is copolymerizable with the (meth)acrylate having an alkyl group, the (meth)acrylate having a phosphate group, and/or the compound having a silane group. The (meth)acrylate having a hydroxyl group may be selected from, but is not limited to, the group of, 2-hydroxyethyl (meth)acrylate, 4-hydroxybutyl (meth)acrylate, 2-hydroxypropyl (meth)acrylate, 2-hydroxybutyl (meth)acrylate, 6-hydroxyhexyl (meth)acrylate, 1,4-cyclohexanedimethanol mono(meth)acrylate, 1-chloro-2-hydroxypropyl (meth)acrylate, diethylene glycol mono (meth)acrylate, 1,6-hexanediol mono(meth)acrylate, pentaerythritol tri(meth)acrylate, dipentaerythritol penta(meth)acrylate, neopentyl glycol mono(meth)acrylate, trimethylolpropane di(meth)acrylate, trimethylolethane di(meth)acrylate, 2-hydroxy-3-phenyloxypropyl (meth)acrylate, 4-hydroxycyclohexyl (meth)acrylate, 2-hydroxy-3-phenyloxy (meth)acrylate, cyclohexanedimethanol mono(meth)acrylate, and mixtures thereof. Accordingly, the hydroxyl group may be included in repeating units derived from the (meth)acrylate having a hydroxyl group.

The (meth)acrylate having an alkyl group may include, e.g., a (meth)acrylic acid ester having a $C_1$-$C_{20}$ linear or branched alkyl group in the ester moiety thereof. The (meth)acrylate having an alkyl group may be selected from, but is not limited to, the group of methyl (meth)acrylate, ethyl (meth)acrylate, propyl (meth)acrylate, n-butyl (meth)acrylate, t-butyl (meth)acrylate, isobutyl (meth)acrylate, pentyl (meth)acrylate, hexyl (meth)acrylate, heptyl (meth)acrylate, octyl (meth)acrylate, 2-ethyl hexyl (meth)acrylate, nonyl (meth)acrylate, decyl (meth)acrylate, lauryl (meth)acrylate, and mixtures thereof. Accordingly, the alkyl group may be included in repeating units derived from the (meth)acrylate having an alkyl group.

The (meth)acrylate having a phosphate group may refer to a monomer that has a phosphate group and is copolymerizable with the (meth)acrylate having a hydroxyl group, the (meth)acrylate having an alkyl group, and/or the compound having a silane group. Accordingly, the phosphate group may be included in repeating units derived from the (meth)acrylate having a phosphate group.

The term "phosphate group" as used herein may refer to —O—P(=O)(OH)$_2$ or —O—P(=O)(OR1)(OR2) (wherein R1 and R2 may each independently be hydrogen, a $C_1$-$C_{10}$ alkyl group, or a $C_6$-$C_{20}$ aryl group). In an implementation, R1 and R2 may each independently be hydrogen or a $C_1$-$C_4$ alkyl group.

The (meth)acrylate having a phosphate group may have a structure of Formula 1, below.

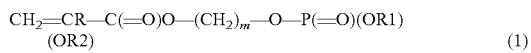
(1)

In Formula 1, R may be —H or —(CH$_2$)$_n$—CH$_3$, n may be an integer from 0 to about 5, R1 and R2 may each independently be hydrogen, a $C_1$-$C_{10}$ alkyl group, or a $C_6$-$C_{20}$ aryl group, and m may be an integer from 1 to about 10.

A non-limiting example of the (meth)acrylate having a phosphate group may include ethylene glycol (meth)acrylate phosphate.

The term "silane" as used herein may refer to —Si(R1)(R2)(R3) (wherein R1, R2, and R3 may each independently be hydrogen, a $C_1$-$C_{10}$ alkyl group, a $C_6$-$C_{20}$ aryl group, or a $C_1$-$C_{10}$ alkoxy group). In an implementation, R1, R2, and R3 may each independently be a $C_1$-$C_4$ alkoxy.

The compound having a silane group may be bonded to the hydroxyl groups of the base binder (prepared by copolymerization of the (meth)acrylate having a hydroxyl group and the (meth)acrylate having an alkyl group). In an implementation, the compound having a silane group may include an isocyanate having a silane group. The isocyanate having a silane group may refer to a monomer that includes a silane group and has an isocyanate group copolymerizable with the (meth)acrylate having a hydroxyl group, an alkyl group, and/or a phosphate group.

The compound having a silane group may be selected from, but is not limited to, the group of 3-isocyanatopropyltriethoxysilane, 3-isocyanatopropyltrimethoxysilane, and mixtures thereof. In an implementation, the compound having a silane group may be 3-isocyanatopropyltriethoxysilane.

The compound having a silane group may refer to a monomer that has a silane group and is copolymerizable with the (meth)acrylate having a hydroxyl group and/or the (meth)acrylate having an alkyl group. Accordingly, the silane group may be included in repeating units derived from the compound having a silane group. For example, the compound having a silane group may have a structure of Formula 2, below.

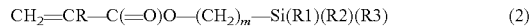
(2)

In Formula 2, R may be —H or —(CH$_2$)$_n$—CH$_3$, n may be an integer from 0 to about 5, R1, R2, and R3 may each independently be hydrogen, a $C_1$-$C_{10}$ alkyl group, a $C_6$-$C_{20}$ aryl group, or a $C_1$-$C_{10}$ alkoxy group, and m may be an integer of 1 to about 10.

In an implementation, R1, R2, and R3 in Formula 2 may each independently be a $C_1$-$C_4$ alkoxy.

For example, the compound having a silane group may be a (meth)acrylate having a silane group, such as methacryloxypropyltrimethoxysilane or γ-methacryloxypropyltriethoxysilane.

When the acrylic copolymer includes the phosphate group, the acrylic copolymer may include about 10 to about 50 parts by weight of the (meth)acrylate having a hydroxyl group, based on 100 parts by weight of the acrylic copolymer. Within this range, adhesion of the acrylic copolymer to a base film (e.g., a polyolefin or polyvinyl chloride film) may be increased; and sufficient reactivity of the acrylic copolymer with the curing agent (e.g., an isocyanate) may be achieved. In an implementation, the (meth)acrylate having a hydroxyl group may be present in an amount of about 20 to about 30 parts by weight.

When the acrylic copolymer includes the phosphate group, the acrylic copolymer may include about 50 to about 85 parts by weight of the (meth)acrylate having an alkyl group, based on 100 parts by weight of the acrylic copolymer. Within this range, high initial tackiness of the acrylic copolymer may be maintained, thereby ensuring sufficient adhesion to a ring frame or an adhesive film. In an implementation, the (meth)acrylate having an alkyl group may be present in an amount of about 60 to about 75 parts by weight.

When the acrylic copolymer includes the phosphate group, the acrylic copolymer may include about 0.5 to about 10 parts by weight of the (meth)acrylate having a phosphate group, based on 100 parts by weight of the acrylic copolymer. Within this range, initial tackiness of the acrylic copolymer may be increased and high pick-up success rate may be ensured along with good adhesion to a ring frame.

When the acrylic copolymer includes the silane group, the acrylic copolymer may include about 20 to about 30 parts by weight of the (meth)acrylate having a hydroxyl group, based on 100 parts by weight of the acrylic copolymer. Within this range, polyaddition of the acrylic copolymer with a silane having an isocyanate group (e.g., a compound to increase adhesion) may be facilitated. In addition, control of polymerization, even upon or during preparation of the acrylic binder, may be facilitated. In an implementation, the (meth)acrylate having a hydroxyl group is present in an amount of about 25 to about 30 parts by weight.

When the acrylic copolymer includes the silane group, the acrylic copolymer may include about 60 to about 77 parts by weight of the (meth)acrylate having an alkyl group, based on 100 parts by weight of the acrylic copolymer. Within this range, sufficient initial tackiness and a high molecular weight of the acrylic copolymer may be obtained. In an implementation, the (meth)acrylate having an alkyl group may be present in an amount of about 60 to about 70 parts by weight.

When the acrylic copolymer includes the silane group, the acrylic copolymer may include about 3 to 10 parts by weight of the compound having a silane group, e.g., the (meth)acrylate having a silane group, based on 100 parts by weight of the acrylic copolymer. Within this range, the initial tackiness of the acrylic copolymer may be increased and high pick-up success rate may be ensured along with good adhesion to a ring frame. In an implementation, the compound having a silane group or the (meth)acrylate having a silane group is present in an amount of about 5 to about 10 parts by weight.

The acrylic copolymer may further include at least one of an epoxy group and a carboxyl group.

An order of arrangement of the alkyl, hydroxyl, phosphate, silane, epoxy, and/or carboxyl groups is not particularly limited, and may be varied as desired. Like groups may be consecutively arranged in blocks in the acrylic copolymer.

In an implementation, the acrylic copolymer may be a copolymer of a (meth)acrylate having at least one hydroxyl group, a (meth)acrylate having at least one alkyl group, a (meth)acrylate having at least one phosphate group, and an unsaturated epoxy compound having at least one epoxy group.

The acrylic copolymer may be prepared by, e.g., copolymerizing a (meth)acrylate having at least one hydroxyl group, a (meth)acrylate having at least one alkyl group, and an unsaturated epoxy compound having at least one epoxy group to prepare a base binder, and reacting the base binder with a (meth)acrylate having at least one phosphate group.

In another implementation, the acrylic copolymer may be a copolymer of a (meth)acrylate having at least one hydroxyl group, a (meth)acrylate having at least one alkyl group, a compound having at least one silane group, and an unsaturated epoxy compound having at least one epoxy group.

The acrylic copolymer may be prepared by copolymerizing a (meth)acrylate having at least one hydroxyl group, a (meth)acrylate having at least one alkyl group, and an unsaturated epoxy compound having at least one epoxy group to prepare a base binder, and reacting the base binder with a compound having at least one silane group.

The (meth)acrylate having a hydroxyl group, the (meth) acrylate having an alkyl group, the (meth)acrylate having a phosphate group, the compound having at least one silane group, e.g., the (meth)acrylate having a silane group, may be the same as those described above.

For example, the unsaturated epoxy compound having an epoxy group may have a structure of Formula 3, below.

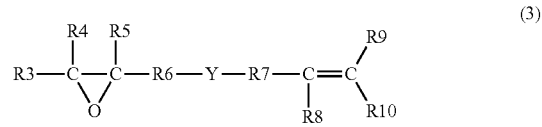

In Formula 3, R3, R4, R5, R8, R9, and R10 may each independently be H, a $C_1$-$C_{12}$ saturated or unsaturated alkyl group, or a $C_6$-$C_{14}$ aryl group (optionally substituted with at least one $C_1$-$C_{12}$ saturated or unsaturated alkyl group), Y may be an ether group (—O—), a carboxyl group (—O(C=O)— or —(C=O)O—), a $C_1$-$C_{12}$ alkylene group, or a $C_6$-$C_{14}$ arylene group (optionally substituted with at least one $C_1$-$C_{12}$ saturated or unsaturated alkyl group). In an implementation, when Y is an ether group (—O—) or a carboxyl group (—O(C=O)— or —(C=O)O—), R6 and R7 may each independently be a single bond, a $C_1$-$C_{12}$ alkylene group, or a $C_6$-$C_{14}$ arylene group (optionally substituted with at least one $C_1$-$C_{12}$ saturated or unsaturated alkyl group). In another implementation, when Y is a $C_1$-$C_{12}$ alkylene group or a $C_6$-$C_{14}$ arylene group (optionally substituted with at least one $C_1$-$C_{12}$ saturated or unsaturated alkyl group), R6 and R7 may be omitted. Accordingly, the epoxy group may be included in repeating units derived from the unsaturated epoxy compound having an epoxy group.

In Formula 3, the $C_1$-$C_{12}$ alkyl group may be a $C_1$-$C_6$ alkyl, e.g., a $C_1$-$C_4$ alkyl, and the $C_1$-$C_{12}$ alkylene group may be a $C_1$-$C_6$ alkylene, e.g., a $C_1$-$C_4$ alkylene.

In Formula, 3, the $C_6$-$C_{14}$ aryl group may be a $C_6$-$C_{10}$ aryl; and the $C_6$-$C_{14}$ arylene group may be a $C_6$-$C_{10}$ arylene.

For example, the unsaturated epoxy compound having an epoxy group may be selected from the group of glycidyl (meth)acrylate, epoxy alkyl acrylate, allyl glycidyl ether, aryl glycidyl ether, vinyl glycidyl ether, glycidyl itaconate, and mixtures thereof.

In an implementation, the (meth)acrylate having a hydroxyl group, the (meth)acrylate having an alkyl group, the (meth)acrylate having a phosphate group, and the unsaturated epoxy compound having an epoxy group may be present in the acrylic copolymer in amounts of about 20 to about 30 parts by weight, about 60 to about 75 parts by weight, about 0.5 to about 3 parts by weight and about 4.5 to about 7 parts by weight, respectively, based on 100 parts by weight of the acrylic copolymer. Within these ranges, detaching of the acrylic copolymer from a ring frame during sawing may be reduced or prevented and satisfactory pick-up performance may be maintained during pick-up.

In another implementation, the (meth)acrylate having a hydroxyl group, the (meth)acrylate having an alkyl group, the compound having a silane group, and the unsaturated epoxy compound having an epoxy group may be present in the acrylic copolymer in amounts of about 20 to about 30 parts by weight, about 50 to about 76 parts by weight, about 3 to about 10 parts by weight and about 1 to about 10 parts by weight, respectively, based on 100 parts by weight of the acrylic copolymer. Within these ranges, adhesion of the acrylic copolymer to an adhesive film layer including an epoxy as a main component may be enhanced, thereby resulting in suitable prevention of chip flying during sawing.

The acrylic copolymer may be a copolymer of a (meth) acrylate having at least one hydroxyl group, a (meth)acrylate having at least one alkyl group, a (meth)acrylate having at least one phosphate group, and a compound, e.g., a (meth) acrylate, having at least one carboxyl group.

The acrylic copolymer may be prepared by, e.g., copolymerizing a (meth)acrylate having at least one hydroxyl group, a (meth)acrylate having at least one alkyl group, and a compound, e.g., a (meth)acrylate, having at least one carboxyl group to prepare a base binder, and reacting the base binder with a (meth)acrylate having at least one phosphate group.

The acrylic copolymer may be a copolymer of a (meth) acrylate having at least one hydroxyl group, a (meth)acrylate having at least one alkyl group, a compound having at least one silane group, and a compound, e.g., a (meth)acrylate, having at least one carboxyl group.

The acrylic copolymer may be prepared by, e.g., copolymerizing a (meth)acrylate having at least one hydroxyl group, a (meth)acrylate having at least one alkyl group, and a compound, e.g., a (meth)acrylate, having at least one carboxyl group to prepare a base binder, and reacting the base binder with a compound having a silane group.

The (meth)acrylate having a hydroxyl group, the (meth)acrylate having an alkyl group, the (meth)acrylate having a phosphate group, and the compound having a silane group may be the same as those described above.

The compound, e.g., the (meth)acrylate, having a carboxyl group may have a structure of Formula 4 or 5, below.

$$CH_2=CR-C(=O)O-(CH_2)_n-COOH \quad (4)$$

In Formula 4, R may be —H or —$(CH_2)_n$—$CH_3$, n may be an integer of 0 to about 5, and r may be an integer of 1 to about 10.

$$CH_2=CR-C(=O)OH \quad (5)$$

In Formula 5, R may be —H or —$(CH_2)_n$—$CH_3$ and n may be an integer of 0 to about 5.

For example, the compound, e.g., the (meth)acrylate, having a carboxyl group may be selected from the group of (meth)acrylic acid, itaconic acid, maleic acid, fumaric acid, and mixtures thereof. The carboxyl group may be included in repeating units derived from the compound, e.g., the (meth) acrylate, having a carboxyl group.

The (meth)acrylate having a hydroxyl group, the (meth)acrylate having an alkyl group, the (meth)acrylate having a phosphate group, and the compound having a carboxyl group may be present in the acrylic copolymer in amounts of about 20 to about 30 parts by weight, about 60 to about 75 parts by weight, about 0.5 to about 3 parts by weight, and about 0.5 to about 7 parts by weight, respectively, based on 100 parts by weight of the acrylic copolymer. Within these ranges, detaching of the acrylic copolymer from a ring frame during sawing may be reduced or prevented and satisfactory pick-up performance may be maintained during pick-up.

The (meth)acrylate having a hydroxyl group, the (meth)acrylate having an alkyl group, the compound, e.g., (meth)acrylate, having a silane group, and the compound having a carboxyl group may be present in the acrylic copolymer in amounts of about 20 to about 30 parts by weight, about 50 to about 76 parts by weight, about 3 to about 10 parts by weight, and about 1 to about 10 parts by weight, respectively, based on 100 parts by weight of the acrylic copolymer. Introduction of the monomer having a carboxyl group within the range defined above may increase adhesion to an adhesive film layer including an organic material as a main component, thereby effectively controlling chip flying during sawing.

The acrylic copolymer may be a copolymer of a (meth) acrylate having at least one hydroxyl group, a (meth)acrylate having at least one alkyl group, a (meth)acrylate having at least one phosphate group, an unsaturated epoxy compound having at least one epoxy group, and a compound having at least one carboxyl group.

The acrylic copolymer may be prepared by, e.g., copolymerizing a (meth)acrylate having at least one hydroxyl group, a (meth)acrylate having at least one alkyl group, an unsaturated epoxy compound having at least one epoxy group, and a compound having at least one carboxyl group to prepare a base binder; and reacting the base binder with a (meth)acrylate having at least one phosphate group.

The acrylic copolymer may be a copolymer of a (meth) acrylate having at least one hydroxyl group, a (meth)acrylate having at least one alkyl group, a compound having at least one silane group, an unsaturated epoxy compound having at least one epoxy group, and compound having at least one carboxyl group.

The acrylic copolymer may be prepared by, e.g., copolymerizing a (meth)acrylate having at least one hydroxyl group, a (meth)acrylate having at least one alkyl group, an unsaturated epoxy compound having at least one epoxy group, and a compound having at least one carboxyl group to prepare a base binder; and reacting the base binder with a compound having at least one silane group.

The (meth)acrylate having a hydroxyl group, the (meth) acrylate having an alkyl group, the (meth)acrylate having a phosphate group, the compound having a silane group, the unsaturated epoxy compound having an epoxy group, and the compound having a carboxyl group may be the same as those described above.

The (meth)acrylate having a hydroxyl group, the (meth) acrylate having an alkyl group, the (meth)acrylate having a phosphate group, the unsaturated epoxy compound having an epoxy group, and the compound having a carboxyl group may be present in the acrylic copolymer in amounts of about 20 to about 30 parts by weight, about 60 to about 75 parts by weight, about 0.5 to about 3 parts by weight, about 4 to about 7 parts by weight, and about 0.5 to about 3 parts by weight, respectively, based on 100 parts by weight of the acrylic copolymer. Within these ranges, detaching of the acrylic copolymer from a ring frame during sawing may be reduced or prevented; and satisfactory pick-up performance may be maintained during pick-up. Simultaneous introduction of the carboxyl and epoxy groups may contribute to further improvement in adhesive strength.

The (meth)acrylate having a hydroxyl group, the (meth) acrylate having an alkyl group, the compound having a silane group, the unsaturated epoxy compound having an epoxy group, and the compound having a carboxyl group may be present in the acrylic copolymer in amounts of about 20 to about 30 parts by weight, about 50 to about 75 parts by weight, about 3 to about 10 parts by weight, about 1 to about 5 parts by weight, and about 1 to about 5 parts by weight, respectively, based on 100 parts by weight of the acrylic copolymer. Within these ranges, adhesion of the acrylic copolymer to an adhesive film layer may be enhanced, thereby resulting in effective prevention of chip flying during sawing.

In an implementation, the acrylic copolymer may be a copolymer of monomers represented by Formulae 1, 6, and 7, below.

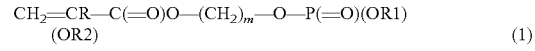

$$CH_2=CR-C(=O)O-(CH_2)_m-O-P(=O)(OR1)(OR2) \quad (1)$$

In Formula 1, R may be —H or —$(CH_2)_n$—$CH_3$, n may be an integer from 0 to about 5, R1 and R2 may each independently be hydrogen, a $C_1$-$C_{10}$ alkyl group or a $C_6$-$C_{20}$ aryl group, and m may be an integer from 1 to about 10.

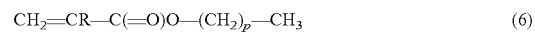

$$CH_2=CR-C(=O)O-(CH_2)_p-CH_3 \quad (6)$$

In Formula 6, R may be —H or —(CH$_2$)$_n$—CH$_3$, n may be an integer from 0 to about 5, and p may be an integer from 0 to about 10.

$$CH_2\!=\!CR\!-\!C(\!=\!O)O\!-\!(CH_2)_q\!-\!OH \qquad (7)$$

In Formula 7, R may be —H or —(CH$_2$)$_n$—CH$_3$, n may be an integer from 0 to about 5, and q may be an integer from 1 to about 10.

For example, the monomers represented by Formulae 1, 6, and 7 may be copolymerized in a molar ratio of about 0.5-2: 70-75:24.5-28. Within this range, detaching of the acrylic copolymer from a ring frame during sawing may be reduced or prevented; and satisfactory pick-up performance may be maintained during pick-up.

In an implementation, the acrylic copolymer may be prepared by copolymerizing the monomers represented by Formulae 6 and 7 to prepare a base binder, and reacting the base binder with a compound having at least one silane group. As a result of the reaction, the compound having a silane group may be bonded to the hydroxyl group of the monomer represented by Formula 7.

In another embodiment, the acrylic copolymer may be a copolymer of one or more of the monomers represented by Formulae 2, 6, and 7. For example, the monomers represented by Formulae 2, 6, and 7 may be copolymerized in a molar ratio of about 3-5.5:65.5-73:24-29. Within this molar ratio, polyaddition of the acrylic copolymer with a silane having an isocyanate group (e.g., a compound to increase adhesion) may be facilitated. In addition control of polymerization, even upon preparation of the acrylic binder, may be facilitated.

The acrylic copolymer may be further copolymerized with one or more monomers selected from the group of the monomers represented by Formulae 3, 4, and 5.

For example, the acrylic copolymer may be prepared by copolymerization of the monomers represented by Formulae 1, 3, 6 and 7 in a molar ratio of about 0.5-2:4-7:64-73.5:22-27. Within this range, detaching of the acrylic copolymer from a ring frame during sawing may be reduced or prevented; and satisfactory pick-up performance may be maintained during pick-up.

For example, the acrylic copolymer may be prepared by copolymerization of the monomer of Formula 1, the monomer of Formula 6, the monomer of Formula 7 and the monomer of Formula 4 or 5 in a molar ratio of about 0.5-2.5:5-8.5: 82-93.5:1-7. Within this range, detaching of the acrylic copolymer from a ring frame during sawing may be reduced or prevented; and satisfactory pick-up performance may be maintained during pick-up.

In an implementation, the acrylic copolymer may be prepared by copolymerization of the monomers represented by Formulae 1, 3, 6, 7, and 4 in a molar ratio of about 0.5-2:4-6.5:59-73.5:21-27:1-5.5. Within this range, detaching of the acrylic copolymer from a ring frame during sawing may be reduced or prevented; and satisfactory pick-up performance may be maintained during pick-up.

For example, the monomer of Formula 6, the monomer of Formula 7, the compound having a silane group, and the monomer of Formula 3 may be present in a molar ratio of about 62.5-72:20-23:3-5.5:5-9. Within this range, adhesion of the acrylic copolymer to an adhesive film layer may be enhanced, thereby resulting in effective prevention of chip flying during sawing.

For example, the monomer of Formula 6, the monomer of Formula 7, the compound having a silane group, and the monomer of Formula 4 or 5 may be present in a molar ratio of about 59.4-76:19-27:3-4.5:2-9. Within this range, adhesion of the acrylic copolymer to an adhesive film layer may be enhanced, thereby resulting in effective prevention of chip flying during sawing.

For example, the monomer of Formula 6, the monomer of Formula 7, the compound having a silane group, the monomer of Formula 3, and the monomer of Formula 4 may be present in a molar ratio of about 53.5-67:18-28:2-5.5:1-4.5: 2-8.5. Within this range, adhesion of the acrylic copolymer to an adhesive film layer may be enhanced, thereby resulting in effective prevention of chip flying during sawing.

For example, the monomer of Formula 6, the monomer of Formula 7, the monomer of Formula 2, and the monomer of Formula 3 may be present in a molar ratio of about 62.5-72: 20-23:3-5.5:5-9. Within this range, adhesion of the acrylic copolymer to an adhesive film layer may be enhanced, thereby resulting in effective prevention of chip flying during sawing.

For example, the monomer of Formula 6, the monomer of Formula 7, the monomer of Formula 2, and the monomer of Formula 4 or 5 may be present in a molar ratio of about 59.4-76:9-27:3-4.5:2-9. Within this range, adhesion of the acrylic copolymer to an adhesive film layer may be enhanced, thereby resulting in effective prevention of chip flying during sawing.

For example, the monomer of Formula 6, the monomer of Formula 7, the monomer of Formula 2, the monomer of Formula 3, and the monomer of Formula 4 may be present in a molar ratio of about 53.5-67:18-28:2-5.5:1-4.5:2-8.5. Within this range, adhesion of the acrylic copolymer to an adhesive film layer may be enhanced, thereby resulting in effective prevention of chip flying during sawing.

An order of arrangement of the repeating units in each of the acrylic copolymers according to the foregoing embodiments is not particularly limited, and may be varied as desired. Like repeating units may also be consecutively arranged in the acrylic copolymer.

The acrylic copolymer may have a weight average molecular weight of about 500,000 to 1,000,000 g/mol, e.g., about 600,000 to 800,000 g/mol. Maintaining the molecular weight within this range may be advantageous in terms of pick-up performance and film forming ability.

The acrylic copolymer may have a viscosity at 25° C. of about 4,000 to 6,000 cps. Within this range, the acrylic copolymer may be readily coated to form an optically clear adhesive film.

The viscosity of the acrylic copolymer may be measured using a suitable viscometer. For example, after about 400 g of the acrylic copolymer is placed in a 500 ml Nalgene bottle (73.8 mm (outer diameter)×169.8 mm (height)), the viscosity of the acrylic copolymer may be measured using a Brookfield viscometer (DV-II+) at about 25° C. and at a spindle rate of about 100 rpm (Spindle #7).

The acrylic copolymer or the base binder for preparation of the acrylic copolymer may be prepared by suitable copolymerization processes including, e.g., emulsion polymerization, suspension polymerization, and bulk polymerization. A polymerization initiator, e.g., azobisisobutyronitrile, may also be used during polymerization.

Curing Agent

The curing agent may be of any suitable type, e.g., a heat curing agent. Examples of curing agents suitable for use in the optically clear adhesive may include, but are not limited to, isocyanate, epoxy, aziridine, melamine, amine, imide, carbodiimide, and amide curing agents. These curing agents may be used alone or as a mixture of two or more thereof. An isocyanate curing agent is preferred.

The isocyanate curing agent may be selected from the group of trimethylolpropane toluene diisocyanate (TMP-adduct), 2,4-trilene diisocyanate, 2,6-trilene diisocyanate, hydrogenated trilene diisocyanate, 1,3-xylene diisocyanate, 1,4-xylene diisocyanate, diphenylmethane-4,4-diisocyanate, 1,3-bis(isocyanatomethyl)cyclohexane, tetramethylxylene diisocyanate, 1,5-naphthalene diisocyanate, 2,2,4-trimethyl hexamethylene diisocyanate, 2,4,4-trimethyl hexamethylene diisocyanate, trilene diisocyanate adducts of trimethylolpropane, xylene diisocyanate adducts of trimethylolpropane, triphenylmethane triisocyanate, methylene bisisocyanate, and mixtures thereof.

The optically clear adhesive may include about 3 to 10 parts by weight of the curing agent, based on 100 parts by weight of the acrylic copolymer. Within this range, the optically clear adhesive may exhibit an adhesive strength sufficient to increase pick-up success rate and may have high initial tackiness to prevent flying of chips cut by sawing or being detached from a ring frame during sawing. In an implementation, the curing agent may be present in an amount of about 5 to 7 parts by weight, based on 100 parts by weight of the acrylic copolymer.

The optically clear adhesive may be prepared by a method including the following steps: copolymerizing a (meth)acrylate having at least one hydroxyl group, a (meth)acrylate having at least one alkyl group, and a (meth)acrylate having at least one phosphate group and/or a (meth)acrylate having at least one silane group to prepare an acrylic copolymer (First step); and adding a curing agent to the acrylic copolymer (Second step).

First Step

In the first step, an acrylic copolymer may be prepared. For example, the acrylic copolymer may be prepared by mixing a (meth)acrylate having at least one hydroxyl group, a (meth)acrylate having at least one alkyl group, and a (meth)acrylate having at least one phosphate group and/or a (meth)acrylate having at least one silane group, and copolymerizing the mixture in the presence of an initiator.

The initiator may be selected from, but not limited to, the group of azobisisobutyronitrile, 2,2'-azobis(2,4-dimethylvaleronitrile), benzoyl peroxide, dilauroyl peroxide, tert-butyl-(2-ethylhexyl)monoperoxycarbonate, tert-amyl-(2-ethylhexyl)monoperoxycarbonate, 1,1-di(tert-butylperoxy)cyclohexane, 1,1-di(tert-amylperoxy)cyclohexane, tert-butylperoxy-3,5,5-trimethylhexanoate, 1,1-di(tert-butylperoxy)-3,3,5-trimethylcyclohexane, potassium persulfate, sodium persulfate, ammonium persulfate, water-soluble azo initiators, and mixtures thereof. Azobisisobutyronitrile is preferred.

The initiator may be used in an amount of about 0.001 to 2 parts by weight, based on 100 parts by weight of the (meth)acrylate having a hydroxyl group.

A solvent capable of dissolving the (meth)acrylate having a hydroxyl group, the (meth)acrylate having an alkyl group, and the (meth)acrylate having a phosphate group may be used. For example, ethyl acetate may be used as the solvent.

At least one monomer selected from the group of unsaturated epoxy compounds having an epoxy group and compounds having a carboxyl group may be further used to prepare the acrylic copolymer.

Polymerization temperature and time conditions may be appropriately controlled. For example, polymerization may be carried out at a temperature of about 65 to 90° C. for about 6 to 10 hr.

Second Step

In the second step, a curing agent may be added to the acrylic copolymer to prepare the optically clear adhesive. For example, the optically clear adhesive may be prepared by adding the acrylic copolymer and the curing agent to methyl ethyl ketone as a solvent, and stirring the mixture at about 25 to about 30° C. for about 30 to about 60 min.

Alternatively, the optically clear adhesive may be prepared by a method including the following steps: copolymerizing a (meth)acrylate having at least one hydroxyl group and a (meth)acrylate having at least one alkyl group to prepare a base binder, and reacting the base binder with a compound having a silane group to prepare an acrylic copolymer (First step); and adding a curing agent to the acrylic copolymer (Second step).

First Step

In the first step, an acrylic copolymer may be prepared. For example, the acrylic copolymer may be prepared by copolymerizing a (meth)acrylate having at least one hydroxyl group and a (meth)acrylate having at least one alkyl group to prepare a base binder, and reacting the base binder with a compound having a silane group.

An initiator may be used in the preparation of the base binder. The initiator may be the same as described above. The initiator may be used in an amount of about 0.001 to about 2 parts by weight, based on 100 parts by weight of the acrylic copolymer.

The reaction between the base binder and the compound having a silane group may be carried out in the absence or presence of a catalyst. Various kinds of catalysts may be used. The catalyst may include, e.g., dibutyltin dilaurate (DBTDL). The catalyst may be used in an amount of about 0.001 to 0.1 parts by weight, based on 100 parts by weight of the base binder.

A solvent capable of dissolving the (meth)acrylate having a hydroxyl group, the (meth)acrylate having an alkyl group, and the compound having a silane group may be further used. For example, ethyl acetate may be used as the solvent.

At least one monomer selected from the group of unsaturated epoxy compounds having an epoxy group and compounds having a carboxyl group may be further used to prepare the base binder.

Polymerization temperature and time conditions for preparation of the base binder may be appropriately controlled. For example, polymerization may be carried out at a temperature of about 65 to about 90° C. for about 6 to about 10 hr.

The reaction between the base binder and the compound having a silane group may be carried out at about 30 to about 50° C. for about 6 to about 8 hr.

Second Step

In the second step, a curing agent may be added to the acrylic copolymer to prepare the optically clear adhesive. This step may be the same as described above.

The optically clear adhesive may not include a photoinitiator. The optically clear adhesive may be used to form an optically clear adhesive layer of a non-UV irradiation type dicing die bonding film. A typical UV irradiation type dicing die bonding film may include an optically clear adhesive layer and a bonding layer. In order to separate the optically clear adhesive layer and the bonding layer, the optically clear adhesive layer may be cured using a photoinitiator. In contrast, the optically clear adhesive according to an embodiment may be used to form an optically clear adhesive layer of a non-UV irradiation type dicing die bonding film, thereby eliminating the need for a photoinitiator.

Another embodiment provides a dicing die bonding film produced using the optically clear adhesive. The optically clear adhesive may form an optically clear adhesive layer of the dicing die bonding film.

The dicing die bonding film may include a base film, an optically clear adhesive layer on the base film, and a bonding layer on the optically clear adhesive layer. The optically clear adhesive layer may be formed of the optically clear adhesive.

FIG. 1 illustrates a dicing die bonding film according to an exemplary embodiment. The dicing die bonding film may include a base film(1), an optically clear adhesive layer(2) formed on the base film(1), and a bonding layer(3) formed on the optically clear adhesive layer(2).

The optically clear adhesive layer or bonding layer may seize or attach to a wafer to prevent the wafer from moving during dicing. The base film may support the optically clear adhesive layer. The base film may be a film that is stretchable at room temperature to increase intervals between individual chips ('expansion process') after dicing, in order to facilitate pick-up of the chips.

Various polymeric materials may be used for the base film. Examples of polymeric materials suitable for the base film may include polyolefins, such as polyethylene, polypropylene, ethylene/propylene copolymers, polybutene-1, ethylene/vinyl acetate copolymers, polyethylene/styrene butadiene rubber blends, and polyvinyl chloride. Polymers such as polyethylene terephthalate, polycarbonate, and poly(methyl methacrylate), thermoplastic elastomers such as polyurethane and polyamide-polyol copolymers, and mixtures thereof may also be used. The base film may have a thickness of about 30 to about 300 µm, e.g., about 50 to about 200 µm, in terms of elongation and workability.

The optically clear adhesive layer may be formed on the base film by various techniques. For example, the optically clear adhesive may be directly coated on the base film to form the optically clear adhesive layer. Alternatively, the optically clear adhesive may be coated on a release film, dried, and transferred to the base film. Any coating technique suitable for forming a uniform coating layer may be used to form the optically clear adhesive layer. For example, bar coating, gravure coating, comma coating, reverse roll coating, applicator coating, spray coating, and/or dip coating may be used.

The optically clear adhesive layer may have a thickness of about 3 to about 40 µm, e.g., about 5 to about 30 µm.

An adhesive strength between the optically clear adhesive layer and a ring frame may be about 1 to about 3 N/25 mm.

Figure 2:
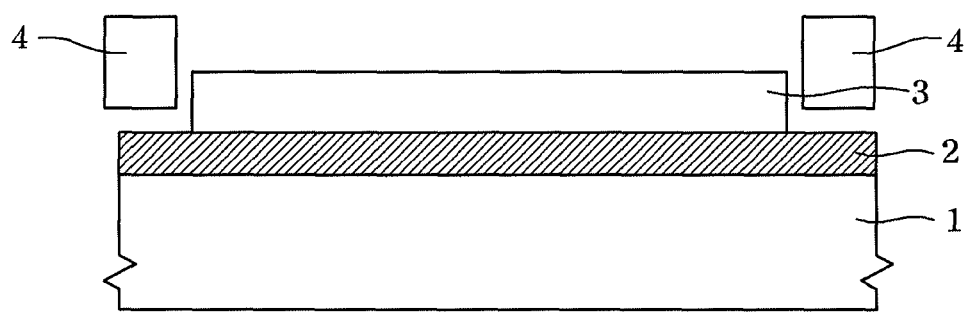
FIG. 2 illustrates a dicing die bonding film according to an exemplary embodiment and a ring frame laminated on the same.

FIG. 2 illustrates a dicing die bonding film according to an exemplary embodiment and a ring frame. A ring frame (4) is laminated on the optically clear adhesive layer(2) of the dicing die bonding film in dicing process.

The bonding layer may be in the form of a film and may be formed of a heat curable composition. The bonding layer should have good adhesion to a ground backside of a wafer. The bonding layer may be composed of heat curable resins and a curing agent. The heat curable resins may include another acrylic copolymer and an epoxy resin that have a high molecular weight and have the ability to form a film. The other acrylic copolymer may include, e.g., an acrylic rubber, which is a copolymer of an acrylic acid ester or a methacrylic acid ester and acrylonitrile. The epoxy resin is not particularly limited, and may exhibit high adhesive strength after curing. The epoxy resin should have two or more functional groups for curing. Examples of such epoxy resins may include bisphenol A epoxy resins, phenol novolac epoxy resins, or cresol novolac epoxy resins. The curing agent may be any of those suitably used for formation of adhesive layers.

A curing accelerator may be used to cure the epoxy resin. The curing accelerator may be an imidazole or amine type. One or more kinds of silane coupling agents may be used to increase the adhesion to a wafer.

Any coating technique suitable for obtaining a uniform coating thickness may be used to form the bonding layer. The coating technique for forming the optically clear adhesive layer may be used to form the bonding layer. The bonding layer may have a coating thickness of about 5 to about 100 µm, e.g., about 10 to about 80 µm.

An adhesive strength between the optically clear adhesive layer and the bonding layer may be about 0.05 to about 0.5 N/25 mm, e.g., about 0.1 to about 0.25 N/25 mm.

The dicing die bonding film may further include a release film to protect the bonding layer from external materials and to facilitate winding in a roll form.

The dicing die bonding film may have a structure in which the optically clear adhesive layer is formed on the base film and the bonding layer is laminated on the optically clear adhesive layer. A semiconductor chip or wafer may be attached to the bonding layer and may be diced into smaller sized chips. The chips may be easily peeled from the underlying optically clear adhesive layer when being picked up. The picked-up chips may then be bonded to a surface of a support member, e.g., a PCB or a lead frame, in a state in which the bonding layer is attached to backsides of the chips ('die bonding').

Another embodiment provides a semiconductor device prepared using the above-described dicing die bonding film. The bonding layer of the dicing die bonding film may be attached to one side of the wafer; and the optically clear adhesive layer of the dicing die bonding film may be fixed on a ring frame.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLES

Preparative Example 1

Preparation of Acrylic Copolymer

After 245 g of ethyl acetate was placed in a 2 L four-neck flask as a reactor, a reflux condenser, a thermometer, and a dropping funnel were connected to the flask. The solvent was heated to reflux at 74° C. A monomer mixture consisting of 2-ethyl hexyl acrylate (372.6 g), 2-hydroxyethyl methacrylate (64.8 g), 2-hydroxyethyl acrylate (64.8 g), and ethylene glycol methacrylate phosphate (10.8 g) was prepared. 513 g of the monomer mixture was mixed with 120 g of toluene and 0.18 g of azobisisobutyronitrile. The mixture was added dropwise to the flask through the dropping funnel at 74° C. for 3 hr with stirring at 250 rpm. After the dropwise addition was finished, the reaction mixture was aged at 85° C. for 4 hr. 120 g of ethyl acetate and 0.2 g of azobisisobutyronitrile were added for 20 min; and the resulting mixture was left standing at 85° C. for 4 hr. The viscosity and solids content of the reaction mixture were measured. The reaction was stopped to yield an acrylic copolymer having a viscosity at 25° C. of 4,000 cps.

Preparative Example 2

Preparation of Acrylic Copolymer

A monomer mixture consisting of 2-ethyl hexyl acrylate (372.6 g), 2-hydroxyethyl methacrylate (64.8 g), 2-hydroxyethyl acrylate (64.8 g), glycidyl methacrylate (27 g), and ethylene glycol methacrylate phosphate (10.8 g) was prepared. 540 g of the monomer mixture was mixed with 120 g of toluene and 0.18 g of azobisisobutyronitrile. The resulting mixture was added dropwise to the same type of flask assembly as used in Preparative Example 1 through the dropping funnel. Thereafter, the procedure of Preparative Example 1 was followed, yielding an acrylic copolymer having a viscosity at 25° C. of 4,500 cps.

Preparative Example 3

Preparation of Acrylic Copolymer

A monomer mixture consisting of 2-ethyl hexyl acrylate (383.4 g), 2-hydroxyethyl methacrylate (64.8 g), and 2-hydroxyethyl acrylate (64.8 g) was prepared. The monomer mixture was mixed with 120 g of toluene and 0.18 g of azobisisobutyronitrile. The resulting mixture was added dropwise to the same type of flask assembly as used in Preparative Example 1 through the dropping funnel. Thereafter, the procedure of Preparative Example 1 was followed, yielding an acrylic copolymer having a viscosity at 25° C. of 3,000 cps.

Preparative Example 4

Preparation of Acrylic Copolymer

A monomer mixture consisting of 2-ethyl hexyl acrylate (383.4 g), 2-hydroxyethyl methacrylate (64.8 g), 2-hydroxyethyl acrylate (64.8 g), and glycidyl methacrylate (27 g) was prepared. The monomer mixture was mixed with 120 g of toluene and 0.18 g of azobisisobutyronitrile. The resulting mixture was added dropwise to the same type of flask assembly as used in Preparative Example 1 through the dropping funnel. Thereafter, the procedure of Preparative Example 1 was followed, yielding an acrylic copolymer having a viscosity at 25° C. of 3,500 cps.

Preparative Example 5

Preparation of Acrylic Copolymer

A monomer mixture consisting of 2-ethyl hexyl acrylate (383.4 g), 2-hydroxyethyl methacrylate (64.8 g), 2-hydroxyethyl acrylate (64.8 g), glycidyl methacrylate (27 g), ethylene glycol methacrylate phosphate (10.8 g), and acrylic acid (10.8 g) was prepared. The monomer mixture was mixed with 120 g of toluene and 0.18 g of azobisisobutyronitrile. The resulting mixture was added dropwise to the same type of flask assembly as used in Preparative Example 1 through the dropping funnel. Thereafter, the procedure of Preparative Example 1 was followed, yielding an acrylic copolymer having a viscosity at 25° C. of 4,800 cps.

Preparative Example 6

Preparation of Acrylic Copolymer

After 245 g of ethyl acetate was placed in a 2 L four-neck flask as a reactor, a reflux condenser, a thermometer, and a dropping funnel were connected to the flask. The solvent was heated to reflux at 74° C. A monomer mixture consisting of 2-ethyl hexyl acrylate (345.6 g), 2-hydroxyethyl methacrylate (64.8 g), and 2-hydroxyethyl acrylate (64.8 g) was prepared. 475.2 g of the monomer mixture was mixed with 120 g of toluene and 0.18 g of azobisisobutyronitrile. The mixture was added dropwise to the flask through the dropping funnel at 74° C. for 3 hr with stirring at 250 rpm. After the dropwise addition was finished, the reaction mixture was aged at 85° C. for 4 hr. 120 g of ethyl acetate and 0.2 g of azobisisobutyronitrile were added for 20 min; and the resulting mixture was left standing at 85° C. for 4 hr. The viscosity and solids content of the reaction mixture were measured. The reaction was stopped to give a base binder. The base binder was cooled to 40° C., and then 37.8 g of 3-isocyanatopropyltriethoxysilane and 100 ppm of DBTDL were added thereto. The mixture was allowed to react at 40° C. for 8 hr, yielding an acrylic copolymer having a viscosity at 25° C. of 4,000 cps. After 400 g of the acrylic copolymer was placed in a 500 ml Nalgene bottle (73.8 mm (outer diameter)×169.8 mm (height)), the viscosity of the acrylic copolymer was measured using a Brookfield viscometer (DV-II+) at 25° C. and at a spindle rate of 100 rpm (Spindle #7).

Preparative Example 7

Preparation of Acrylic Copolymer

A monomer mixture consisting of 2-ethyl hexyl acrylate (345.6 g), 2-hydroxyethyl methacrylate (64.8 g), 2-hydroxyethyl acrylate (64.8 g), and glycidyl methacrylate (27 g) was prepared. 540 g of the monomer mixture was mixed with 120 g of toluene and 0.18 g of azobisisobutyronitrile. The resulting mixture was added dropwise to the same type of flask assembly as used in Preparative Example 6 through the dropping funnel with stirring at 250 rpm. After the dropwise addition was finished, the reaction mixture was aged at 85° C. for 4 hr. 120 g of ethyl acetate and 0.2 g of azobisisobutyronitrile were added for 20 min; and the resulting mixture was left standing at 85° C. for 4 hr. The viscosity and solids content of the reaction mixture were measured. The reaction was stopped to give a base binder. The base binder was cooled to 40° C.; and then 37.8 g of 3-isocyanatopropyltriethoxysilane and 100 ppm of DBTDL were added thereto. The mixture was allowed to react at 40° C. for 8 hr, yielding an acrylic copolymer having a viscosity at 25° C. of 4,500 cps.

Preparative Example 8

Preparation of Acrylic Copolymer

A monomer mixture consisting of 2-ethyl hexyl acrylate (383.4 g), 2-hydroxyethyl methacrylate (64.8 g), and 2-hydroxyethyl acrylate (64.8 g) was prepared. The monomer mixture was mixed with 120 g of toluene and 0.18 g of azobisisobutyronitrile. The resulting mixture was added dropwise to the same type of flask assembly as used in Preparative Example 6 through the dropping funnel. Thereafter, the procedure of Preparative Example 1 was followed, yielding an acrylic copolymer having a viscosity at 25° C. of 3,000 cps.

Preparative Example 9

Preparation of Acrylic Copolymer

A monomer mixture consisting of 2-ethyl hexyl acrylate (345.6 g), 2-hydroxyethyl methacrylate (64.8 g), 2-hydroxyethyl acrylate (64.8 g), and glycidyl methacrylate (27 g) was prepared. The monomer mixture was mixed with 120 g of toluene and 0.18 g of azobisisobutyronitrile. The resulting mixture was added dropwise to the same type of flask assembly as used in Preparative Example 6 through the dropping funnel. Thereafter, the procedure of Preparative Example 1 was followed, yielding an acrylic copolymer having a viscosity at 25° C. of 3,500 cps.

Preparative Example 10

Preparation of Acrylic Copolymer

A monomer mixture consisting of 2-ethyl hexyl acrylate (383.4 g), 2-hydroxyethyl methacrylate (64.8 g), 2-hydroxyethyl acrylate (64.8 g), and acrylic acid (27 g) was prepared. The monomer mixture was mixed with 120 g of toluene and 0.18 g of azobisisobutyronitrile. The resulting mixture was added dropwise to the same type of flask assembly as used in Preparative Example 6 through the dropping funnel with stirring at 250 rpm. After the dropwise addition was finished, the reaction mixture was aged at 85° C. for 4 hr. 120 g of ethyl acetate and 0.2 g of azobisisobutyronitrile were added for 20 min, and the resulting mixture was left standing at 85° C. for 4 hr. The viscosity and solids content of the reaction mixture were measured. The reaction was stopped to give a base binder. The base binder was cooled to 40° C.; and then 37.8 g of 3-isocyanatopropyltriethoxysilane and 100 ppm of DBTDL were added thereto. The mixture was allowed to react at 40° C. for 8 hr, yielding an acrylic copolymer having a viscosity at 25° C. of 4,800 cps.

Details of components used in Examples 1-6 and Comparative Examples 1-4 were as follows:
1. Acrylic copolymers: As prepared in Preparative Examples 1-10
2. Curing agent: Trimethylolpropane toluene diisocyanate (TMP-adduct type, AK-75, Aekyung Chemical (Korea)) as an isocyanate curing agent Examples 1-6 and Comparative Examples 1-4

The components were added in amounts as shown in Tables 1 and 2 to 25 parts by weight of methyl ethyl ketone. The mixtures were stirred at 25° C. for 1 hr to prepare compositions for dicing die bonding films.

TABLE 1

| | | Examples | | | | | |
|---|---|---|---|---|---|---|---|
| | | 1 | 2 | 3 | 4 | 5 | 6 |
| Acrylic copolymers (parts by weight) | Preparative Example 1 | 100 | — | — | — | — | — |
| | Preparative Example 2 | — | 100 | — | — | — | — |
| | Preparative Example 3 | — | — | — | — | — | — |
| | Preparative Example 4 | — | — | — | — | — | — |
| | Preparative Example 5 | — | — | 100 | — | — | — |
| | Preparative Example 6 | — | — | — | 100 | — | — |
| | Preparative Example 7 | — | — | — | — | 100 | — |
| | Preparative Example 8 | — | — | — | — | — | — |
| | Preparative Example 9 | — | — | — | — | — | — |
| | Preparative Example 10 | — | — | — | — | — | 100 |
| Curing agent (parts by weight) | | 7 | 7 | 7 | 7 | 7 | 7 |

TABLE 2

| | | Comparative Examples | | | |
|---|---|---|---|---|---|
| | | 1 | 2 | 3 | 4 |
| Acrylic copolymers (parts by weight) | Preparative Example 1 | — | — | — | — |
| | Preparative Example 2 | — | — | — | — |
| | Preparative Example 3 | 100 | — | — | — |
| | Preparative Example 4 | — | 100 | — | — |
| | Preparative Example 5 | — | — | — | — |
| | Preparative Example 6 | — | — | — | — |
| | Preparative Example 7 | — | — | — | — |
| | Preparative Example 8 | — | — | 100 | — |
| | Preparative Example 9 | — | — | — | 100 |
| | Preparative Example 10 | — | — | — | — |
| Curing agent (parts by weight) | | 7 | 7 | 7 | 7 |

Experimental Example 1

Measurement of Physical Properties of Compositions for Dicing Die Bonding Films

Each of the film compositions prepared in Examples 1-6 and Comparative Examples 1-4 was coated to a thickness of 8 μm on a PET release film, transferred to a polyolefin film as a base film, and aged at 25° C. for 3 days. The aged sample was laminated on a bonding layer (to which another PET release film had been attached) to complete the production of a film having a 4-layer structure (including the PET release film, the bonding layer, the optically clear adhesive layer, and the polyolefin base film). Physical properties of the films were measured by the following methods. The results are shown in Table 3, below.

Formation of the Bonding Layer 69 parts by weight of an acrylic rubber binder (SG-P3, Nagase Chemtex 17%), 13 parts by weight of an epoxy resin (EPPN-501H, Nippon Kayaku 81%), 7 parts by weight of a phenol curing agent (HF-1M, Meiwa, 50%), 1 part by weight of a silane additive (KBM-403, Shinetsu, 100%), 0.5 parts by weight of a curing accelerator (TPP-K, HOKKO, 100%), and 9.5 parts by weight of a filler (R-972, Degussa, 100%) were placed in a 1 L cylindrical flask; and then cyclohexanone was added thereto. The mixture was dispersed using a high-speed stirring bar at 5,000 rpm for 30 min to prepare a composition. The composition was filtered through a 200-mesh filter and coated to a thickness of 20 μm on a PET release film (38 μm, 50 μm, TS-002, Toyobo) using an applicator to form the bonding layer. The bonding layer was dried at 100° C. for 20 min and stored at room temperature for 1 day.

<Methods of Measurement of Physical Properties>

Peel strength between the bonding layer and the optically clear adhesive layer of each of the dicing die bonding films produced in Examples 1-6 and Comparative Examples 1-4 was measured in accordance with Korean Industrial Standard KS-A-01107 (8) (testing method for optically clear adhesive tapes and sheets). First, the dicing die bonding film was pressed by one reciprocation of a press roller under a load of 2 kg at a rate of 300 mm/min. 30 minutes after pressing, a portion of the test piece was folded, turned over 180°, and peeled (~25 mm). The test piece was positioned on an upper clip of a tensile tester (Instron Series IX/s Automated Materials Tester-3343); and the die bonding film was fixed to a lower clip of the tensile tester. The load required to peel the test piece by pulling at a tensile rate of 300 mm/min was measured.

Peel strength between the optically clear adhesive film and a ring frame (SUS) was measured in accordance with Korean Industrial Standard KS-A-01107 (8) (testing method for optically clear adhesive tapes and sheets). First, a sample (25 mm×250 mm (1)) of the optically clear adhesive film was attached to the ring frame (SUS) and was pressed by one reciprocation of a press roller under a load of 2 kg at a rate of 300 mm/min. 30 minutes after pressing, a portion of the test piece was folded, turned over 180°, and peeled (~25 mm). The test piece and the ring frame (SUS) were respectively fixed to an upper clip and a lower clip of a tensile tester (Instron Series IX/s Automated Materials Tester-3343). The load required to peel the test piece by pulling at a tensile rate of 300 mm/min was measured.

Tackiness of the test piece produced above was measured using a probe tack tester (tacktoc-2000). Pursuant to the test method of ASTM D2979-71, a tip of a clean probe was brought into contact with the optically clear adhesive layer of the test piece at a rate of 10±0.1 mm/sec and a contact load of 9.79±1.01 kPa for 1.0±0.01 sec. The maximum force required to separate the tip from the optically clear adhesive layer was measured.

Pick-up success rate: After the PET release film was removed from the dicing die bonding film, a wafer was mounted and diced into chips. 200 chips in the central portion of the wafer were picked up using a die bonder (SDB-10M, Mechatronics); and the pick-up success rate for the chips was measured.

Detachment from ring frame: Immediately after wafer mounting, wafer sawing was performed to cut the wafer into pieces for the assembly of an IC package. The wafer was cut using a physical dicing saw or laser. During dicing, the silicon wafer as attached to a dicing tape. One side of the dicing tape contained an adhesive component to fix the tape to a wafer frame. Portions, called dies, left on the tape after wafer sawing were attached to a lead frame or a PCB. Portions, called die streets, cut out after wafer sawing had a width of about 75 μm. The dies were used for next processing using a die bonder and a die sorter. The dies were about 0.5-35 mm in size and were rectangular or square in shape because the wafer was processed in a straight line. The dicing was performed using a dicing apparatus (Disco). "X" indicates that the detachment did not occur, "P" indicates that partial detachment occurred, and "O" indicates that full detachment occurred.

Detachment rate (%): After 20 wafers were sawn, an observation was made to determine whether detachment occurred. The detachment rate was expressed as a percentage.

TABLE 3

|  | Examples |  |  |  |  |  | Comparative Examples |  |  |  |
|---|---|---|---|---|---|---|---|---|---|---|
|  | 1 | 2 | 3 | 4 | 5 | 6 | 1 | 2 | 3 | 4 |
| Peel strength between bonding and optically clear adhesive layers (N/25 mm) | 0.107 | 0.119 | 0.132 | 0.125 | 0.130 | 0.142 | 0.102 | 0.12 | 0.102 | 0.12 |
| Peel strength between optically clear adhesive layer and SUS (N/25 mm) | 1.685 | 1.718 | 1.733 | 2.020 | 2.118 | 2.232 | 0.782 | 0.90 | 0.782 | 0.90 |
| Tackiness (gf/mm$^2$) | 21 | 22 | 24 | 23 | 25 | 29 | 14 | 15 | 14 | 15 |
| Pick-up success rate (%) | 100 | 100 | 100 | 100 | 100 | 100 | 100 | 100 | 100 | 100 |
| Detachment from ring frame | X | X | X | X | X | X | O | O | P | O |
| Detachment rate (%) | 0 | 0 | 0 | 0 | 0 | 0 | 65 | 45 | 65 | 45 |

As may be seen from the results in Table 3, the optically clear adhesives of Examples 1-6 exhibited better adhesion to the ring frames without being detached from the ring frames, and showed higher pick-up success rates. In contrast, the optically clear adhesives of Comparative Examples 1 and 2 (each including the acrylic copolymer prepared without the use of any monomer having a phosphate group) showed low pick-up success rates, compared to those of Examples 1 and 2, respectively, and were detached from the ring frames. In addition, the optically clear adhesives of Comparative Examples 3 and 4 (each including the acrylic copolymer prepared without the use of any compound having a silane group) showed low pick-up success rates, compared to those of Examples 6 and 7, respectively, and were at least partially detached from the ring frames.

By way of summation and review, photocurable films may be suitable for a dicing process due to their high tackiness prior to photocuring. However, photocurable films should be irradiated with UV radiation for a pick-up process after dicing. UV irradiation may be troublesome in terms of processing. Another concern may be that photocurable films are likely to be defective during pick-up when they are not supplied with sufficient UV energy.

In contrast, non-UV irradiation type films may not suffer from troublesome problems associated with UV irradiation. Dicing films developed hitherto have a problem of poor adhesion to ring frames. In an attempt to compensate for low adhesive strength of conventional dicing films, a highly adhesive film may be attached to a portion of the dicing film to which a ring frame is to be attached, which is troublesome.

Accordingly, the embodiments provide a non-UV irradiation type dicing die bonding film that eliminates the need for troublesome UV irradiation in the fabrication of semiconductor devices and does not require attachment of additional highly adhesive films. The embodiments provide an optically clear adhesive for a dicing die bonding film that includes an acrylic copolymer having a phosphate group and/or a silane group to achieve increased adhesion to a ring frame and high pick-up success rate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optically clear adhesive for a dicing die bonding film including a base film; an optically clear adhesive layer on the base film; and a bonding layer on the optically clear adhesive layer, the optically clear adhesive layer being formed from the optically clear adhesive, the optically clear adhesive comprising:
    a curing agent; and
    a (meth)acrylic copolymer that is a copolymer of a mixture of monomers including a (meth)acrylate having at least one alkyl group, a (meth)acrylate having at least one hydroxyl group, and at least one of a (meth)acrylate having at least one phosphate group and a (meth)acrylate having at least one silane group,
    wherein a peel strength between the optically clear adhesive layer formed from the optically clear adhesive and a stainless steel ring frame is about 1 N/25 mm to about 3 N/25 mm, the peel strength being determined by:
    attaching a sample of the optically clear adhesive layer to the stainless steel ring frame,
    pressing by one reciprocation of a press roller under a load of 2 kg at a rate of 300 mm/min,
    folding, turning over 180°, and peeling about 25 mm of a portion of the sample 30 minutes after the pressing,
    respectively fixing the sample and the stainless steel ring frame to an upper clip and a lower clip of a tensile tester, and
    measuring a load required to peel the sample by pulling at a tensile rate of 300 mm/min, and
    wherein the (meth)acrylic copolymer has a weight average molecular weight of 500,000 g/mol to 1,000,000 g/mol.

2. The optically clear adhesive as claimed in claim 1, wherein the (meth)acrylic copolymer is a copolymer of the (meth)acrylate having at least one hydroxyl group, the (meth)acrylate having at least one alkyl group, and the (meth)acrylate having at least one phosphate group.

3. The optically clear adhesive as claimed in claim 2, wherein the (meth)acrylate having at least one phosphate group has a structure of Formula 1:

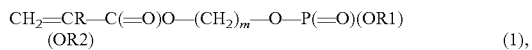

wherein, in Formula 1, R is —H or —(CH$_2$)$_n$—CH$_3$, n is an integer from 0 to about 5, R1 and R2 are each independently hydrogen, a $C_1$-$C_{10}$ alkyl group, or a $C_6$-$C_{20}$ aryl group, and m is an integer from 1 to about 10.

4. The optically clear adhesive as claimed in claim 3, wherein the (meth)acrylate having at least one phosphate group is ethylene glycol (meth)acrylate phosphate.

5. The optically clear adhesive as claimed in claim 2, wherein the (meth)acrylate having at least one phosphate group is present in the (meth)acrylic copolymer in an amount of about 0.1 to about 10 parts by weight, based on 100 parts by weight of the acrylic copolymer.

6. The optically clear adhesive as claimed in claim 2, wherein the (meth)acrylate having at least one phosphate group, the (meth)acrylate having at least one alkyl group, and the (meth)acrylate having at least one hydroxyl group are present in the (meth)acrylic copolymer in a molar ratio of about 0.5-2:70-75:24.5-28.

7. The optically clear adhesive as claimed in claim 1, wherein the (meth)acrylic copolymer is prepared by copolymerizing the (meth)acrylate having at least one hydroxyl group with the (meth)acrylate having at least one alkyl group to prepare a base binder, and reacting the base binder with the (meth)acrylate having at least one silane group.

8. The optically clear adhesive as claimed in claim 1, wherein the (meth)acrylic copolymer is a copolymer of the (meth)acrylate having at least one hydroxyl group, the (meth)acrylate having at least one alkyl group, and the (meth)acrylate having at least one silane group.

9. The optically clear adhesive as claimed in claim 8, wherein the (meth)acrylate having at least one silane group has a structure of Formula 2:

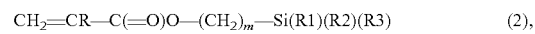

wherein, in Formula 2, R is —H or —(CH$_2$)$_n$—CH$_3$, n is an integer from 0 to about 5, R1, R2, and R3 are each independently hydrogen, a $C_1$-$C_{10}$ alkyl group, a $C_6$-$C_{20}$ aryl group, or a $C_1$-$C_{10}$ alkoxy group, and m is an integer from 1 to about 10.

10. The optically clear adhesive as claimed in claim 8, wherein the (meth)acrylate having at least one silane group, the (meth)acrylate having at least one alkyl group, and the (meth)acrylate having at least one hydroxyl group are present in the (meth)acrylic copolymer in a molar ratio of about 3-5.5:65.5-73:24-29.

11. The optically clear adhesive as claimed in claim 8, wherein the (meth)acrylate having at least one silane group is present in the (meth)acrylic copolymer in an amount of about 3 to about 10 parts by weight, based on 100 parts by weight of the (meth)acrylic copolymer.

12. The optically clear adhesive as claimed in claim 1, wherein the (meth)acrylic copolymer includes at least one of an epoxy group and a carboxyl group.

13. The optically clear adhesive as claimed in claim 12, wherein the epoxy group is included in a repeating unit derived from an unsaturated epoxy compound having a structure of Formula 3:

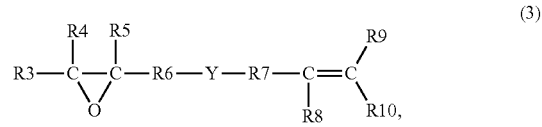

wherein, in Formula 3, R3, R4, R5, R8, R9, and R10 are each independently H, a $C_1$-$C_{12}$ saturated or unsaturated alkyl group, or a $C_6$-$C_{14}$ aryl group optionally substituted with at least one $C_1$-$C_{12}$ saturated or unsaturated alkyl group, Y is an ether group (—O—), a carboxyl group (—O(C=O)— or —(C=O)O—), a $C_1$-$C_{12}$ alkylene group, or a $C_6$-$C_{14}$ arylene group optionally substituted with at least one $C_1$-$C_{12}$ saturated or unsaturated alkyl group, provided that, when Y is an ether group (—O—) or a carboxyl group (—O(C=O)— or —(C=O)O—), R6 and R7 are each independently a single bond, a $C_1$-$C_{12}$ alkylene group, or a $C_6$-$C_{14}$ arylene group optionally substituted with at least one $C_1$-$C_{12}$ saturated or unsaturated alkyl group, and provided that, when Y is a $C_1$-$C_{12}$ alkylene group or a $C_6$-$C_{14}$ arylene group optionally substituted with at least one $C_1$-$C_{12}$ saturated or unsaturated alkyl group, R6 and R7 are omitted.

14. The optically clear adhesive as claimed in claim 12, wherein the (meth)acrylic copolymer is a copolymer of the (meth)acrylate having at least one hydroxyl group, the (meth)acrylate having at least one alkyl group, at least one of the (meth)acrylate having at least one phosphate group and the (meth)acrylate having at least one silane group, and at least one of an unsaturated epoxy compound having at least one epoxy group and a compound having at least one carboxyl group.

15. The optically clear adhesive as claimed in claim 14, wherein the (meth)acrylic copolymer is formed using the compound having at least one carboxyl group, the compound having at least one carboxyl group having a structure of Formula 4 or 5:

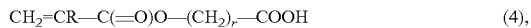

$$CH_2=CR—C(=O)O—(CH_2)_r—COOH \quad (4),$$

wherein, in Formula 4, R is —H or —$(CH_2)_n$—$CH_3$, n is an integer from 0 to about 5, and r is an integer from 1 to about 10;

$$CH_2=CR—C(=O)OH \quad (5),$$

wherein, in Formula 5, R is —H or —$(CH_2)_n$—$CH_3$ and n is an integer from 0 to about 5.

16. The optically clear adhesive as claimed in claim 14, wherein the (meth)acrylate having at least one phosphate group, the unsaturated epoxy compound having at least one epoxy group, the (meth)acrylate having at least one alkyl group, and the compound having at least one carboxyl group are present in the (meth)acrylic copolymer in a molar ratio of about 0.5-2:4-7:64-73.5:22-27.

17. The optically clear adhesive as claimed in claim 14, wherein the (meth)acrylate having at least one phosphate group, the (meth)acrylate having at least one alkyl group, the (meth)acrylate having at least one hydroxyl group, and the compound having at least one carboxyl group are present in the (meth)acrylic copolymer in a molar ratio of about 0.5-2.5:5-8.5:82-93.5:1-7.

18. The optically clear adhesive as claimed in claim 14, wherein the (meth)acrylate having at least one phosphate group, the unsaturated epoxy compound having at least one epoxy group, the (meth)acrylate having at least one alkyl group, the (meth)acrylate having at least one hydroxyl group and the compound having at least one carboxyl group are present in the (meth)acrylic copolymer in a molar ratio of about 0.5-2:4-6.5:59-73.5:21-27:1-5.5.

19. The optically clear adhesive as claimed in claim 14, wherein the (meth)acrylate having at least one alkyl group, the (meth)acrylate having at least one hydroxyl group, the (meth)acrylate having at least one silane group, and the unsaturated epoxy compound having at least one epoxy group are present in the (meth)acrylic copolymer in a molar ratio of about 62.5-72:20-23:3-5.5:5-9.

20. The optically clear adhesive as claimed in claim 14, wherein the (meth)acrylate having at least one alkyl group, the (meth)acrylate having at least one hydroxyl group, the (meth)acrylate having at least one silane group, and the compound having at least one carboxyl group are present in the (meth)acrylic copolymer in a molar ratio of about 59.4-76:9-27:3-4.5:2-9.

21. The optically clear adhesive as claimed in claim 14, wherein the (meth)acrylate having at least one alkyl group, the (meth)acrylate having at least one hydroxyl group, the (meth)acrylate having at least one silane group, the unsaturated epoxy compound having at least one epoxy group, and the compound having at least one carboxyl group are present in the (meth)acrylic copolymer in a molar ratio of about 53.5-67:18-28:2-5.5:1-4.5:2-8.5.

22. The optically clear adhesive as claimed in claim 1, wherein the optically clear adhesive does not include photoinitiator.

23. The optically clear adhesive as claimed in claim 1, wherein the (meth)acrylic copolymer has a viscosity at 25° C. of about 4,000 to about 6,000 cps.

24. A dicing die bonding film, comprising:
a base film;
an optically clear adhesive layer on the base film; and
a bonding layer on the optically clear adhesive layer,
wherein the optically clear adhesive layer is formed of the optically clear adhesive as claimed in claim 1.

25. The dicing die bonding film as claimed in claim 24, wherein a peel strength between the optically clear adhesive layer and the bonding layer is about 0.05 to about 0.5 N/25 mm, the peel strength being determined by:
pressing a sample of the dicing die bonding film by one reciprocation of a press roller under a load of 2 kg at a rate of 300 mm/min,
folding, turning over 180°, and peeling about 25 mm of a portion of the sample 30 minutes after the pressing,
fixing the sample to an upper clip and a lower clip of a tensile tester, and
measuring a load required to peel the sample by pulling at a tensile rate of 300 mm/min.

26. A semiconductor device prepared using the dicing die bonding film as claimed in claim 24, wherein the bonding layer of the dicing die bonding film is attached to one side of a wafer and the optically clear adhesive layer of the dicing die bonding film is fixed on a ring frame.

* * * * *